United States Patent
Hirano

(10) Patent No.: US 7,859,940 B2
(45) Date of Patent: Dec. 28, 2010

(54) SEMICONDUCTOR INTEGRATED CIRCUITS INCLUDING CLOCK DELAY CONTROL CIRCUITS FOR NON-VOLATILE MEMORIES

(75) Inventor: Makoto Hirano, Yokohama (JP)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 217 days.

(21) Appl. No.: 12/216,663

(22) Filed: Jul. 9, 2008

(65) Prior Publication Data

US 2009/0016128 A1     Jan. 15, 2009

(30) Foreign Application Priority Data

Jul. 9, 2007     (JP) .............................. 2007-180049
Mar. 12, 2008   (KR) ...................... 10-2008-0022989

(51) Int. Cl.
    *G11C 8/00*     (2006.01)
(52) U.S. Cl. ............................. 365/233.18; 365/233.1; 365/233.11
(58) Field of Classification Search .................. 365/194, 365/189.07, 189.08, 230.06, 233.1, 231.11, 365/233.18
    See application file for complete search history.

(56) References Cited

U.S. PATENT DOCUMENTS 6,430,696 B1 * 8/2002 Keeth ........................ 713/503
6,618,320 B2 * 9/2003 Hasegawa et al. ......... 365/233.1
7,035,148 B2 * 4/2006 Chung et al. ............ 365/189.05
2008/0209266 A1 * 8/2008 Lee et al. ...................... 714/16

FOREIGN PATENT DOCUMENTS

JP     2005-228427     8/2005

* cited by examiner

*Primary Examiner*—Anh Phung
*Assistant Examiner*—Hien N Nguyen
(74) *Attorney, Agent, or Firm*—Harness, Dickey & Pierce, P.L.C.

(57) ABSTRACT

A semiconductor integrated circuit may include: a mode register and a clock delay control circuit. The mode register may store latency information corresponding to a plurality of frequencies. The clock delay control circuit may generate a delay clock signal using an external clock signal and the latency information. The delay clock signal may be used to control a timing margin of output data read during synchronous burst read operations of a non-volatile memory. A non-volatile memory device may include the semiconductor integrated circuit and a data output unit. The data output unit may use the delay clock signal to control the timing margin of the output data read during synchronous burst read operations. A memory system may include the semiconductor integrated circuit. A computing system may the semiconductor integrated circuit, as well as one or more of a memory controller, bus, modem, microprocessor, user interface, and battery.

20 Claims, 8 Drawing Sheets

Fig. 4

(Related Art)

| Parameter | Symbol | | 7B 54MHz | | 7C 66MHz | | 7D 83MHz | | 7E 108MHz | | Unit |
|---|---|---|---|---|---|---|---|---|---|---|---|
| | | | Min | Max | Min | Max | Min | Max | Min | Max | |
| Burst Access Time Valid Clock to Output Delay | tBA | Spec. | - | 14.5 | - | 11 | - | 9 | - | 7 | ns |
| Data Hold Time from Next Clock Cycle | tBDH | Spec. | 4 | - | 3 | - | 3 | - | 2 | - | ns |
| Recommended Latency | | | 4 | - | 5 | - | 6 | - | 8 | - | Cycle |

SEMICONDUCTOR INTEGRATED CIRCUITS INCLUDING CLOCK DELAY CONTROL CIRCUITS FOR NON-VOLATILE MEMORIES

PRIORITY STATEMENT

This application claims priority from Japanese Patent Application No. 2007-180049, filed on Jul. 9, 2007, in the Japan Patent Office (JPO), and from Korean Patent Application No. 10-2008-0022989, filed on Mar. 12, 2008, in the Korean Intellectual Property Office (KIPO), the entire contents of both of which are incorporated herein by reference.

BACKGROUND

1. Field

Example embodiments relate to semiconductor integrated circuits controlling synchronous burst read data of non-volatile memories. Also, example embodiments relate to semiconductor integrated circuits controlling data output timing of data output units, non-volatile memory devices including semiconductor integrated circuits controlling synchronous burst read data and/or data output timing of data output units, and/or memory and/or computing systems including semiconductor integrated circuits controlling synchronous burst read data and/or data output timing of data output units.

2. Description of Related Art

In relation to synchronous burst read operations of non-volatile memories, time relationships typically are prescribed between a clock signal and output data.

FIG. 3 is a related art pulse row showing a time relationship between a clock signal and output data. Referring to FIG. 3, data may be confirmed when a burst access time tBA elapses, after a first external clock signal CLK rises, in a case of output data. Additionally, data may be kept maintained during a data hold time tBDH, after the data is confirmed and before the next external clock signal CLK rises.

FIG. 4 is a related art table illustrating relationships between frequency of an external clock signal CLK, burst access time tBA, and/or data hold time tBDH. Referring to FIG. 4, when a clock frequency is 54 MHz, the maximum value of a burst access time tBA may be 14.5 nanoseconds (ns) and/or the minimum value of a data hold time tBDH may be 4 ns. Additionally, when a clock frequency is 108 MHz, the maximum value of a burst access time tBA may be 7 ns and/or the minimum value of a data hold time tBDH may be 2 ns. The above related art table also may show recommended latency for each clock frequency.

FIG. 5 is a related art block diagram illustrating a relationship between a data output unit and a clock signal during a synchronous burst read operation. Referring to FIG. 5, an external clock signal CLK may be inputted into a clock input buffer 40 through a clock pad 50 of a memory chip. The external clock signal CLK' outputted from the clock input buffer 40 may be inputted to a burst counter 30-1 and/or a data output driver 30-2 of a data output unit 30. Pipeline data read from a memory array 70 through a burst read operation may be controlled by the external clock signal CLK inputted into the burst counter 30-1 and/or the data output driver 30-2 of the data output unit 30, and/or may be outputted from a data output pad 60 to the external. A mode register 20 may exist on the same memory chip, but may not be related to the data output unit 30.

FIG. 6 is a timing diagram illustrating output timing of output data. In FIG. 6, a reference symbol "○" represents a burst access time tBA and/or a data hold time tBDH of output data outputted from the data output pad 60 of FIG. 5 with respect to each clock frequency. Commonly, it may be designed to achieve the maximum timing margin with respect to the maximum clock frequency. Because of this, with respect to a clock frequency of 108 MHz, a data hold time tBDH and/or a burst data access tBA may be designed to be 4.5 ns, which may be an average value of the minimum value of 2 ns in a data hold time tBDH and the maximum value of 7 ns in a burst access time tBA. Therefore, the maximum timing margin may be achieved.

If a clock frequency becomes lower, for example, due to the above property, there may be only a timing margin of 0.5 ns with respect to the minimum value of 4 ns in a data hold time tBDH at 54 MHz. Thus, system design of a memory may be faced with some difficulties. Conventional art discloses an intention of optimizing the timing of output data through a delayed locked loop (DLL) circuit (that may include a phase comparison circuit, comparing phases between an internal clock and a delay clock, and a variable delay additional circuit, adjusting delay amounts through a signal from the phase comparison circuit). However, this DLL circuit may have a large scale such that it may be difficult to reduce a chip size and/or its power consumption may be relatively high.

SUMMARY

Example embodiments may provide a semiconductor integrated circuits that may improve timing margins of output data during synchronous burst read operations of non-volatile memories. Example embodiments also may provide non-volatile memory devices including semiconductor integrated circuits that may improve timing margins of output data during synchronous burst read operations. Additionally, example embodiments may provide memory systems and/or computing systems including semiconductor integrated circuits that may improve timing margins of output data during synchronous burst read operations.

According to example embodiments, a semiconductor integrated circuit may include a mode register and/or a clock delay control circuit. The mode register may store latency information corresponding to a plurality of frequencies. The clock delay control circuit may generate a delay clock signal using an external clock signal and the latency information. The delay clock signal may be used to control a timing margin of output data read during synchronous burst read operations of a non-volatile memory.

According to example embodiments, a non-volatile memory device may include a semiconductor integrated circuit and/or a data output unit. The semiconductor integrated circuit may include a mode register and/or a clock delay control circuit. The mode register may store latency information corresponding to a plurality of frequencies. The clock delay control circuit may generate a delay clock signal using an external clock signal and the latency information. The data output unit may use the delay clock signal to control a timing margin of output data read during synchronous burst read operations of the non-volatile memory device.

According to example embodiments, a memory system may include a semiconductor integrated circuit. The semiconductor integrated circuit may include a mode register and/or a clock delay control circuit. The mode register may store latency information corresponding to a plurality of frequencies. The clock delay control circuit may generate a delay clock signal using an external clock signal and the latency information. The delay clock signal may be used to control a timing margin of output data read during synchronous burst read operations of a non-volatile memory.

According to example embodiments, a computing system may include a semiconductor integrated circuit. The semiconductor integrated circuit may include a mode register and/or a clock delay control circuit. The mode register may store latency information corresponding to a plurality of frequencies. The clock delay control circuit may generate a delay clock signal using an external clock signal and the latency information. The delay clock signal may be used to control a timing margin of output data read during synchronous burst read operations of a non-volatile memory.

BRIEF DESCRIPTION OF THE DRAWINGS

The above and/or other aspects and advantages will become more apparent and more readily appreciated from the following detailed description of example embodiments taken in conjunction with the accompanying drawings, in which:

FIG. 4 is a related art table illustrating relationships between frequency of an external clock signal CLK, burst access time tBA, and data hold time tBDH;

DETAILED DESCRIPTION OF EXAMPLE EMBODIMENTS

Figure 1:
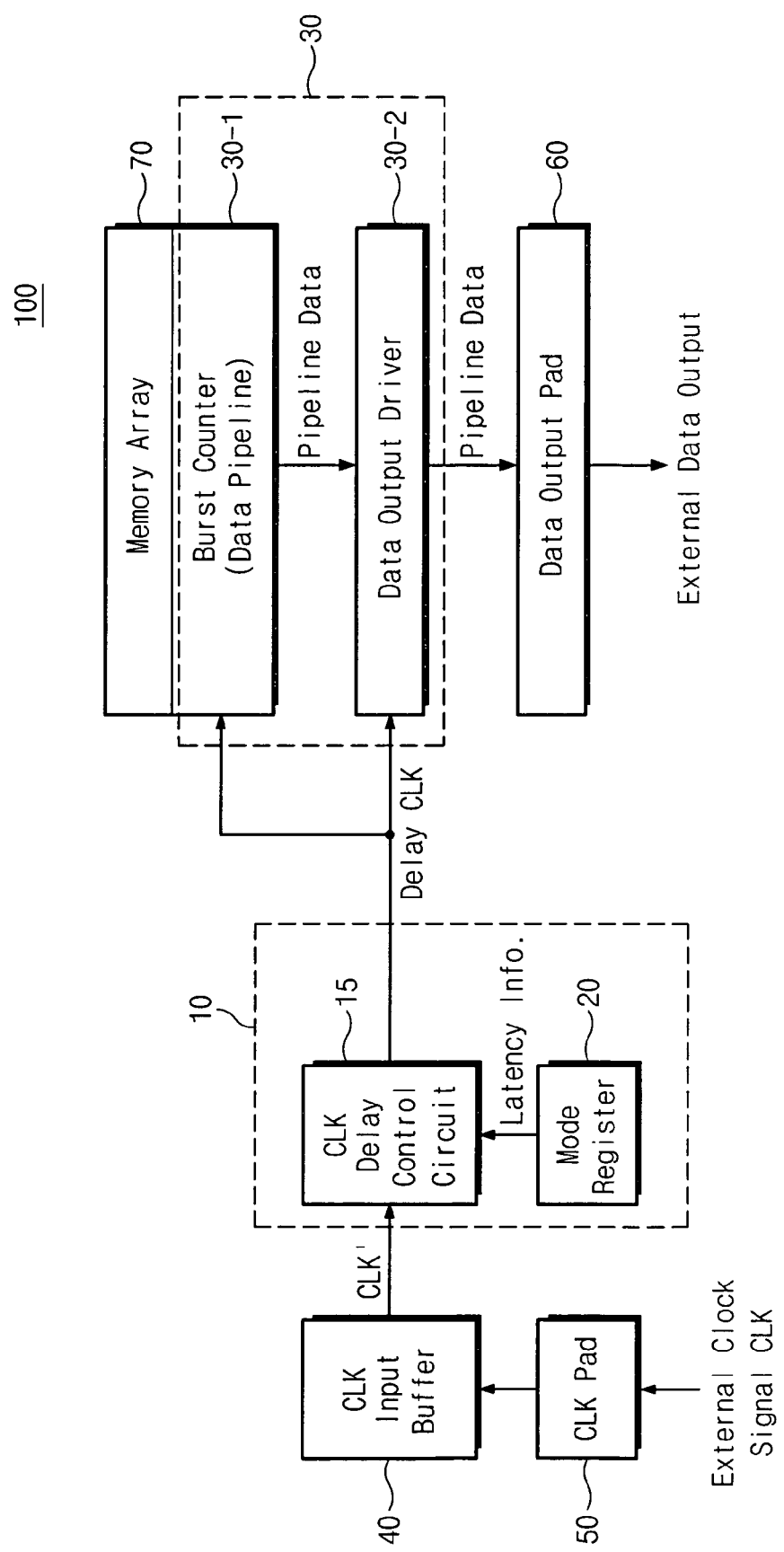
FIG. 1 is a block diagram illustrating a relationship between a clock delay controller and a data output unit according to example embodiments.

Example embodiments will now be described more fully with reference to the accompanying drawings. Embodiments, however, may be embodied in many different forms and should not be construed as being limited to the embodiments set forth herein. Rather, these example embodiments are provided so that this disclosure will be thorough and complete, and will fully convey the scope to those skilled in the art. In the drawings, the thicknesses of layers and regions are exaggerated for clarity.

It will be understood that when an element is referred to as being "on," "connected to," "electrically connected to," or "coupled to" to another component, it may be directly on, connected to, electrically connected to, or coupled to the other component or intervening components may be present. In contrast, when a component is referred to as being "directly on," "directly connected to," "directly electrically connected to," or "directly coupled to" another component, there are no intervening components present. As used herein, the term "and/or" includes any and all combinations of one or more of the associated listed items.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference will now be made to example embodiments, which are illustrated in the accompanying drawings, wherein like reference numerals may refer to like components throughout.

The semiconductor integrated circuit of example embodiments may receive an external clock signal from a clock input buffer and/or may control a delay of the external clock signal based on a latency information signal for each frequency stored in a mode register. A delay clock signal generated by a clock delay control circuit may be inputted to a burst counter and/or a data output driver of a data output unit, thereby improving a timing margin of synchronous burst read data in a non-volatile memory. A clock delay control circuit according to example embodiments may have smaller circuit scale and/or lower power consumption than a related art delayed locked loop (DLL) circuit. Accordingly, a non-volatile memory device and/or system including the semiconductor integrated circuit may have smaller circuit scale and/or lower power consumption.

FIG. 1 is a block diagram illustrating a relationship between a clock delay controller 10 and a data output unit 30 according to example embodiments. Example embodiments of the semiconductor integrated circuit may include the clock delay controller 10 and/or a clock input buffer 40. The clock delay controller 10 may include a clock delay control circuit 15 and/or a mode register 20. Example embodiments may include employing the semiconductor integrated circuit in a non-volatile memory 100 performing synchronous burst read operations.

Figure 5:
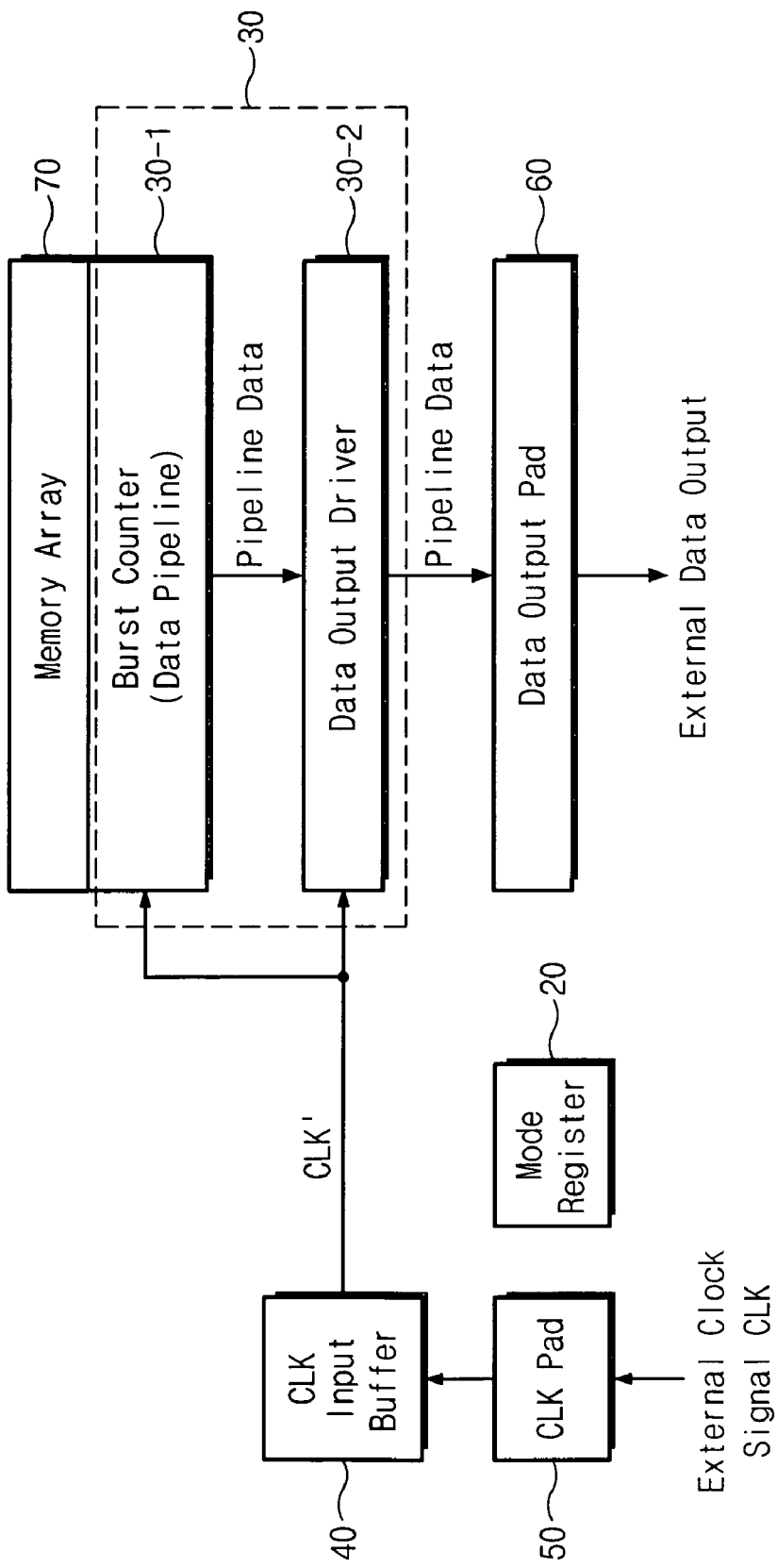
FIG. 5 is a related art block diagram illustrating a relationship between a data output unit and a clock signal during a synchronous burst read operation.

Referring to FIG. 1, an external clock signal CLK' outputted from the clock input buffer 40 may be inputted into the clock delay control circuit 15 of the clock delay controller 10. The clock delay controller 10 may control a delay of the external clock signal CLK' based on a latency information signal Latency Info. (i.e., additional information such as output intensity information corresponding to a frequency stored in the mode register 20). The delay clock signal Delay CLK may be inputted to a burst counter 30-1 and/or a data output driver 30-2 of the data output unit 30. A path transferring a clock signal according to example embodiments may be different from a related art path in the structure of FIG. 5. The magnitude of the latency information may increase as the frequency increases.

The clock delay control circuit 15 may receive a signal of four cycles (i.e., a latency information signal of FIG. 4) from the mode register 20 when a clock frequency is 54 MHz, and/or may control a delay of the external clock signal CLK' outputted from the clock input buffer 40. The delay clock signal Delay CLK generated by a control of the clock delay control circuit 15 may be inputted to the burst counter 30-1 and/or the data output driver 30-2 of the data output unit 30. As a result, pipeline data read from a memory array 70 through a burst read operation may be outputted from a data output pad 60 as output data.

Figure 6:
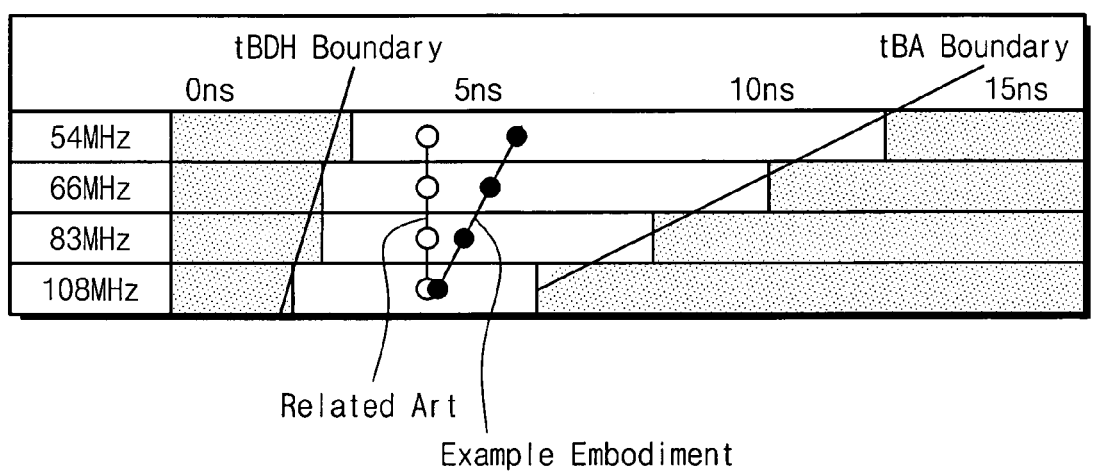
FIG. 6 is a timing diagram illustrating output timing of output data.

As shown as "●" in FIG. 6, a data hold time tBDH and/or a burst access time tBA of output data may have a value of, for example, 8 ns. Thus, it may be 4 ns longer than the minimum value of 4 ns for the data hold time tBDH and/or 6.5 ns shorter than the maximum value of 14.5 ns for the burst access time tBA. According to example embodiments, a timing margin may be improved, for example, in an aspect of the data hold time tBDH.

Similarly, when a clock frequency is 66 MHz, 83 MHz, or 108 MHz, the clock delay control circuit 15 may receive signals of 5, 6, and/or 8 cycles (i.e., the latency information signal of FIG. 4), and then may control a delay of the external clock signal CLK' outputted from the clock input buffer 40. Moreover, the clock delay control circuit 15 may output a delay clock signal delay CLK, that may be generated by controlling a delay of the external clock signal CLK', into the burst counter 30-1 and/or the data output driver 30-2 of the data output unit 30. As a result, the data hold time tBDH and/or the burst access time tBA of the output data outputted from the data output pad 60 may be shifted toward the maximum value of the burst access time tBA, as shown as "●" of FIG. 6, such that a timing margin in an aspect of the data hold time tBDH may be improved. The shift may or may not be linear. However, a magnitude of the timing margin to the data hold time tBDH may increase as the frequency decreases FIG. 2 is a block diagram of a clock delay control circuit 15 in a clock delay controller 10 according to example embodiments.

Figure 2:
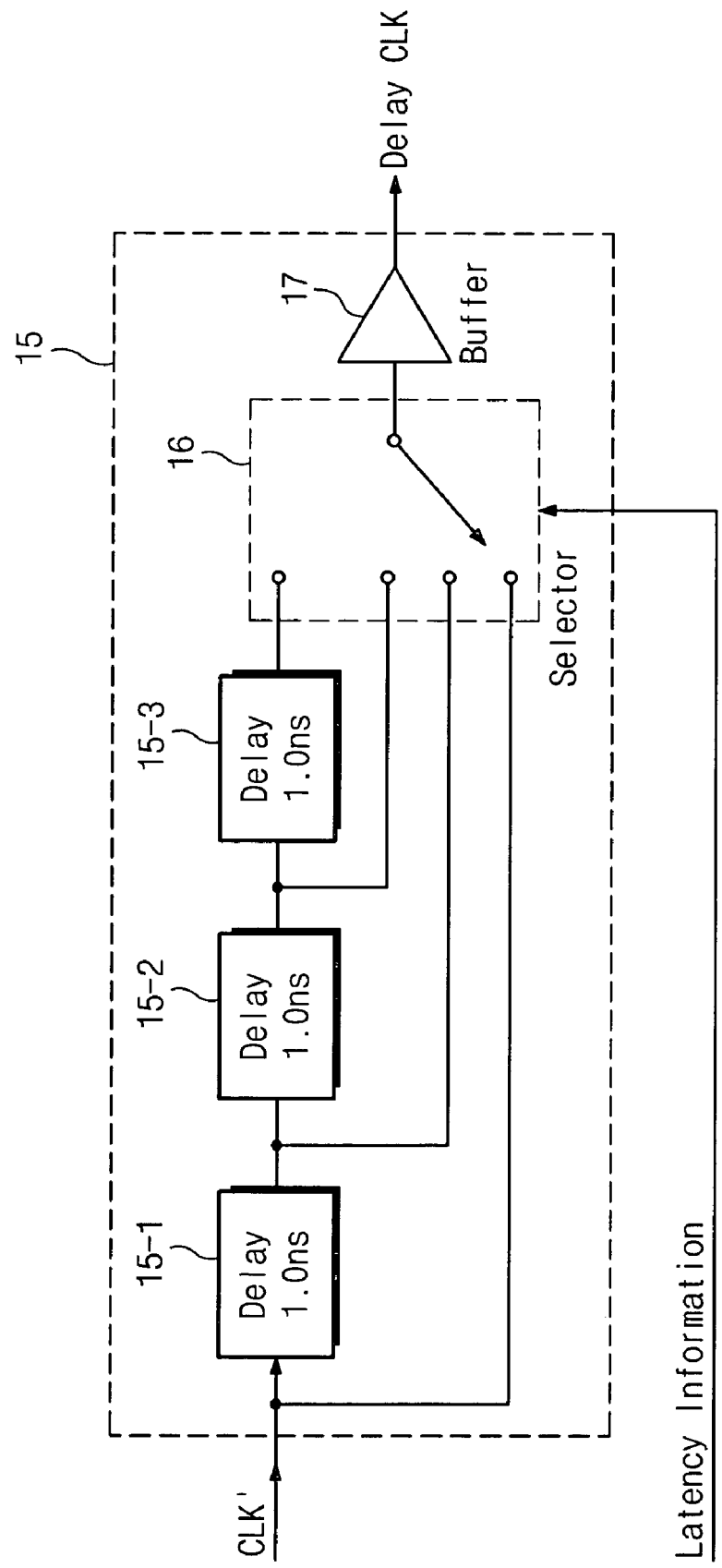
FIG. 2 is a block diagram of a clock delay control circuit in a clock delay controller according to example embodiments.
Figure 3:
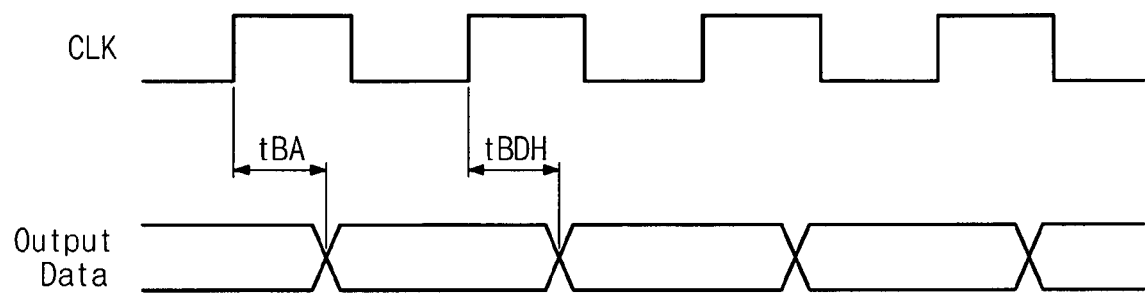
FIG. 3 is a related art pulse row showing a time relationship between a clock signal and output data.

Referring to FIG. 2, the clock delay control circuit 15 may include a plurality of delay circuits 15-1, 15-2, and 15-3, a selector 16, and/or a buffer 17. The delay circuits 15-1, 15-2, and 15-3 may be connected in cascade to each other. One end of the delay circuits 15-1, 15-2, and 15-3 may be connected to an output terminal of the clock input buffer 40, and/or the other end may be connected to one of a plurality of input terminals of the selector 16. Other input terminals of the selector 16 may be connected to the output terminal of the clock input buffer 40 and/or connection nodes of the cascade connected delay circuits 15-1, 15-2, and 15-3. Additionally, a control terminal of the selector 16 may be connected to an output terminal of the mode register 20, and/or an output terminal of the selector 16 may be connected to an input terminal of a buffer 17. An output terminal of the buffer 17 may be connected to input terminals of the burst counter 30-1 and/or the data output driver 30-2 of the data output unit 30.

The delay circuits 15-1, 15-2, and 15-3 may delay the external clock signal CLK' provided from the clock input buffer 40 by respectively different delay amounts (for example, 0 ns, 1.0 ns, 2.0 ns, and/or 3.0 ns). The selector 16 may receive a latency information signal corresponding to a frequency of the external clock signal CLK' outputted from the clock input buffer 40 as a control signal from the mode register 20. One of the delay clock signals having delay amount such as 0 ns, 1.0 ns, 2.0 ns, or 3.0 ns may be selected based on the above control signal. The buffer 17 may provide a result selected by the selector 16 to the burst counter 30-1 and/or the data output driver 30-2 as a delay clock signal Delay CLK.

According to example embodiments, pipeline data read by a burst read operation from the memory array 70 may be controlled by the delay clock signal Delay CLK inputted into the burst counter 30-1 and/or the data output driver 30-2 of the data output unit 30. Consequently, the data hold time tBHD and/or the burst access time tBA of the output data outputted from the data output pad 60 may be shifted toward the maximum value of the burst access time tBA, as shown as "●" in FIG. 6, such that a timing margin in an aspect of the data hold time tBDH may be improved. This clock delay control circuit 15 may have a smaller circuit scale and/or a lower power consumption than a related art DLL circuit.

According to example embodiments, a semiconductor integrated circuit is provided that may be capable of improving a timing margin of output data during a synchronous burst read operation of the non-volatile memory, that may have a small circuit scale, and/or may have low power consumption. Therefore, increases in chip size and/or power consumption due to memory capacity increases may be prevented.

Figure 7:
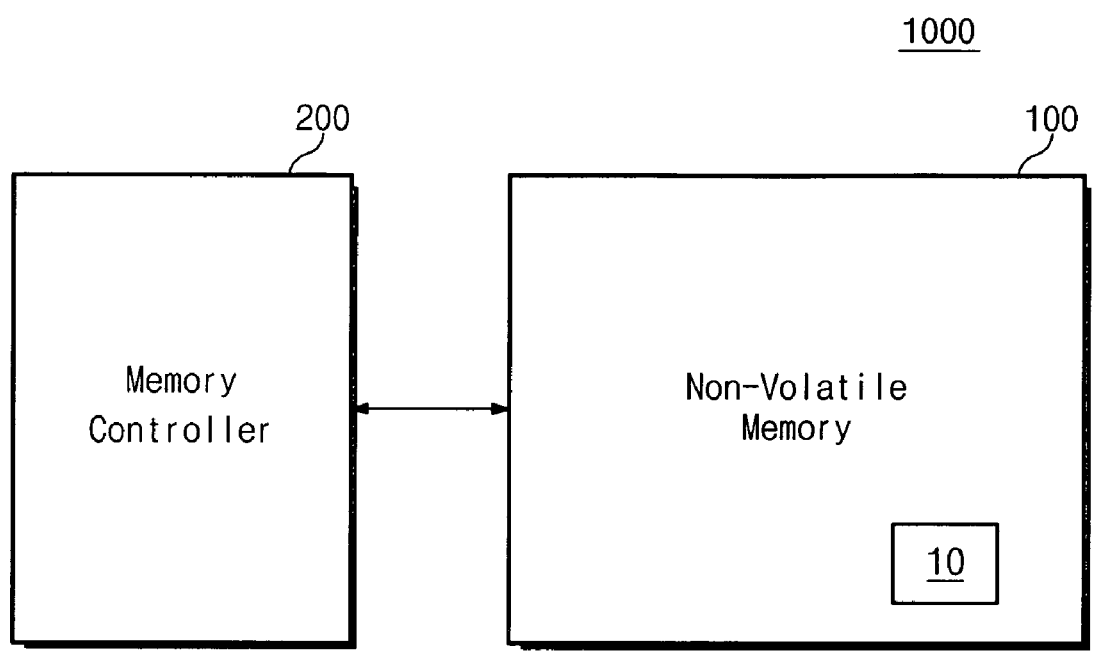
FIG. 7 is a block diagram of a memory system according to example embodiments.

FIG. 7 is a block diagram of a memory system 1000 according to example embodiments.

Referring to FIG. 7, the memory system 1000 may include a non-volatile memory 100, such as a flash memory device, and/or a memory controller 200. A structure of the non-volatile memory 100 may be, for example, substantially similar to that of FIG. 1. The memory controller 200 may be configured to control general operations of the non-volatile memory 100. As mentioned above, pipeline data read by a burst read operation of the non-volatile memory 100 may be controlled by the delay clock signal Delay CLK, which may be generated from the clock input buffer 40 and/or the clock delay controller 10. The data hold time tBDH and/or the burst access time tBA of the output data outputted from the data output pad 60 may be shifted toward the maximum value of the burst access time tBA, as shown as "●" in FIG. 6. As a result, a timing margin of the data hold time tBDH may be improved. In example embodiments, the clock delay control circuit 15 in the clock delay controller 10 may have a smaller circuit scale and/or a lower power consumption than a related art DLL circuit. Therefore, the semiconductor integrated circuit of example embodiments and/or the non-volatile memory 100 including a semiconductor integrated circuit may have a smaller circuit scale and/or a lower power consumption.

Also, the non-volatile memory 100 of example embodiments may be or may be part of a memory card and/or a memory card system. In this case, the memory controller 200 may be configured to communicate with the external (e.g., a host) through a protocol for various interfaces, such as an universal serial bus (USB), a multi media card (MMC), a peripheral component interconnect express (PCI-E), an advanced technology attachment (ATA), a serial advanced technology attachment (SATA), a parallel advanced technology attachment (PATA), a small computer system interface (SCSI), an enhanced small disk interface (ESDI), or an integrated drive electronics (IDE). As described above, a memory of the semiconductor integrated circuit according to example embodiments may be a non-volatile memory that retains its stored data even when there is no power supply. Due to this property, the non-volatile memory 100 may be used as a data storage, and/or also may be used as a code storage for retaining its must-be-retained contents regardless of power supply. In addition, the non-volatile memory 100 may be used in mobile devices such as a mobile phone, a personal digital assistant (PDA), a digital camera, a portable game console, and/or an MP3 player, and also may be used in a home application, such as a high-definition television (HDTV), a digital versatile disk or a digital video disk (DVD), a router, and/or a global positioning system (GPS).

Figure 8:
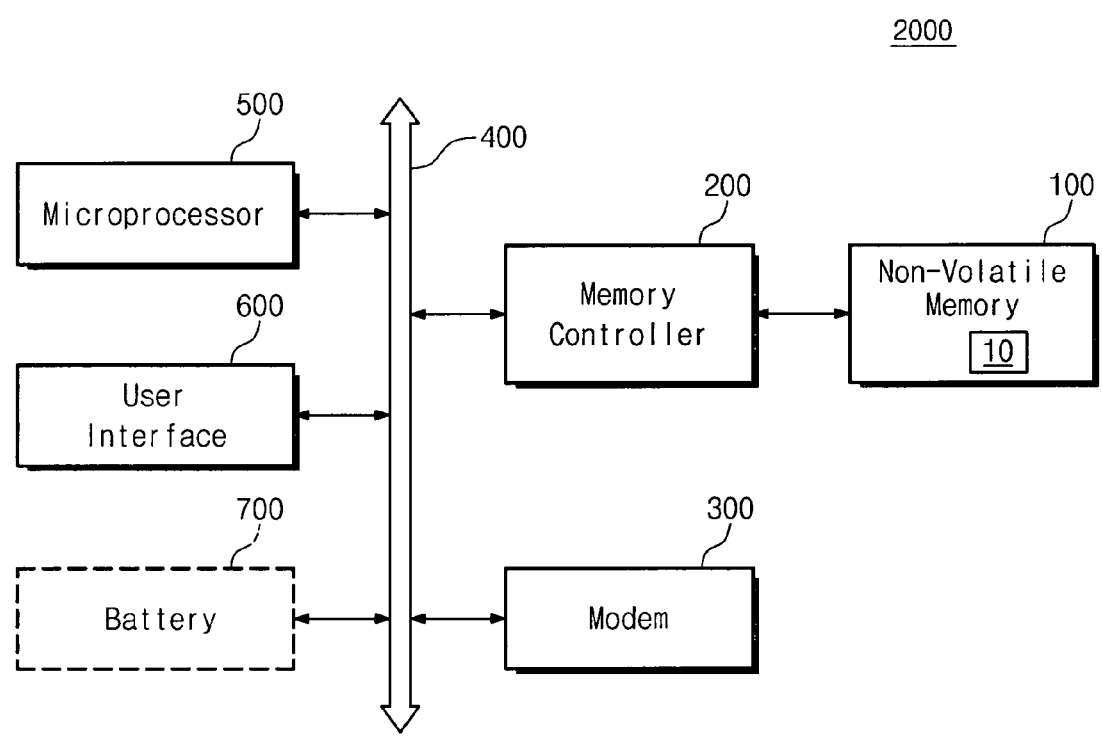
FIG. 8 is a block diagram of a computing system according to example embodiments.

FIG. 8 is a block diagram of a computing system 2000 according to example embodiments.

Referring to FIG. 8, the computing system 2000 according to example embodiments may include the non-volatile memory 100, a memory controller 200, a modem 300 (such as a baseband chipset), a microprocessor 500, and/or a user interface 600, which may be electrically connected to a bus 400. The non-volatile memory 100 of FIG. 8 may have a structure substantially similar to that of FIG. 1. N-bit data (N is an integer greater than or equal to 1) processed/to be processed by the microprocessor 500 may be stored in the non-volatile memory 100 through the memory controller 200.

If the computing system 2000 according to example embodiments is a mobile device, a battery 700 may be additionally provided to supply an operating voltage to the computing system 2000. Although not illustrated in the drawings, it should apparent to those skilled in the art that an application chipset, a camera image processor (CIS), a mobile dynamic random access memory (DRAM), etc., may be further provided in the computing system 2000 according to example embodiments. The memory controller 200 and/or the non-volatile memory 100 may constitute a solid state drive/disk (SSD) using a non-volatile memory to store data, for example.

The non-volatile memory 100 and/or the memory controller 200 may be mounted using various types of packages. Examples of the packages may include package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi chip package (MCP), wafer-level fabricated package (WFP), wafer-level processed stack package (WSP), etc. In example embodiments, memory cells constituting the non-volatile memory 100 may be realized with one of various cell structures having a charge storage layer. It should be apparent to those skilled in the art that a charge trap flash structure using a charge trap layer, a stack flash structure having multilayer-stacked arrays, a flash structure without a source and a drain, and/or a pin-type flash structure may be applied to the above cell structure having a charge storage layer.

According to the semiconductor integrated circuit of example embodiments, a semiconductor integrated circuit is provided that may be capable of improving a timing margin of output data during a synchronous burst read operation of a non-volatile memory, may have a small circuit scale, and/or may have low power consumption. Accordingly, increases in chip size and/or power consumption due to memory capacity increases may be prevented.

While example embodiments have been particularly shown and described, it will be understood by those of ordinary skill in the art that various changes in form and details may be made therein without departing from the spirit and scope of the present invention as defined by the following claims.

What is claimed is:

1. A semiconductor integrated circuit, comprising:
   a mode register; and
   a clock delay control circuit;
   wherein the mode register stores latency information corresponding to a plurality of frequencies,
   wherein the clock delay control circuit generates a delay clock signal using an external clock signal and the latency information,
   wherein the delay clock signal is used to control a timing margin of output data read during synchronous burst read operations of a non-volatile memory, and
   wherein a magnitude of the latency information increases as the frequency increases.

2. The semiconductor integrated circuit of claim 1, further comprising:
   a clock input buffer;
   wherein the clock input buffer provides the external clock signal to the clock delay control circuit.

3. The semiconductor integrated circuit of claim 1, wherein the clock delay control circuit comprises:
   a plurality of delay circuits;
   a selector; and
   a buffer;
   wherein the plurality of delay circuits delay the external clock signal by respectively different delay amounts,
   wherein the selector includes:
      input terminals;
      a control terminal; and
      an output terminal;
   wherein the input terminals are respectively connected to connection nodes of the delay circuits,
   wherein the control terminal selects one of the delay circuits,
   wherein the control terminal is connected to the mode register,
   wherein the output terminal is connected to the buffer, and
   wherein the buffer outputs an output of the selected delay circuit as the delay clock signal.

4. The semiconductor integrated circuit of claim 3, wherein the delay circuits are connected in cascade to each other.

5. The semiconductor integrated circuit of claim 3, wherein the latency information is applied to the control terminal to control the selection of the control terminal.

6. A non-volatile memory device, comprising:
   the semiconductor integrated circuit of claim 1; and
   a data output unit;
   wherein the data output unit uses the delay clock signal to control the timing margin of output data read during synchronous burst read operations of the non-volatile memory of the non-volatile memory device.

7. A memory system comprising the semiconductor integrated circuit of claim 1.

8. The memory system of claim 7, further comprising:
   a data output unit;

wherein the data output unit uses the delay clock signal to control the timing margin of the output data read during the synchronous burst read operations of the non-volatile memory.

9. The memory system of claim 7, further comprising:
a memory controller;
wherein the memory controller is connected to the non-volatile memory.

10. A computing system comprising the semiconductor integrated circuit of claim 1.

11. The computing system of claim 10, further comprising:
a data output unit;
wherein the data output unit uses the delay clock signal to control the timing margin of the output data read during the synchronous burst read operations of the non-volatile memory.

12. The computing system of claim 10, further comprising:
a memory controller;
wherein the memory controller is connected to the non-volatile memory.

13. The computing system of claim 10, further comprising:
a memory controller;
a bus;
a microprocessor; and
a user interface;
wherein the memory controller is connected to the non-volatile memory, and
wherein the bus is connected to the memory controller, the microprocessor, and the user interface.

14. The computing system of claim 10, further comprising:
a memory controller;
a bus;
a modem;
a microprocessor; and
a user interface;
wherein the memory controller is connected to the non-volatile memory, and
wherein the bus is connected to the memory controller, the modem, the microprocessor, and the user interface.

15. The computing system of claim 10, further comprising:
a memory controller;
a bus;
a microprocessor;
a user interface; and
a battery;
wherein the memory controller is connected to the non-volatile memory, and
wherein the bus is connected to the memory controller, the microprocessor, the user interface, and the battery.

16. The computing system of claim 15, wherein the battery is removable, rechargeable, or removable and rechargeable.

17. The computing system of claim 10, further comprising:
a memory controller;
a bus;
a modem;
a microprocessor;
a user interface; and
a battery;
wherein the memory controller is connected to the non-volatile memory, and
wherein the bus is connected to the memory controller, the modem, the microprocessor, the user interface, and the battery.

18. The computing system of claim 17, wherein the battery is removable, rechargeable, or removable and rechargeable.

19. A semiconductor integrated circuit, comprising:
a mode register; and
a clock delay control circuit;
wherein the mode register stores latency information corresponding to a plurality of frequencies,
wherein the clock delay control circuit generates a delay clock signal using an external clock signal and the latency information,
wherein the delay clock signal is used to control a timing margin of output data read during synchronous burst read operations of a non-volatile memory, and
wherein a magnitude of the timing margin to a data hold time increases as the frequency decreases.

20. A non-volatile memory device, comprising:
the semiconductor integrated circuit of claim 19; and
a data output unit;
wherein the data output unit uses the delay clock signal to control the timing margin of output data read during synchronous burst read operations of the non-volatile memory of the non-volatile memory device.

* * * * *